United States Patent [19]

Ohta et al.

[11] Patent Number: 5,693,964
[45] Date of Patent: Dec. 2, 1997

[54] FIELD-EFFECT TRANSISTOR AND FABRICATION METHOD

[75] Inventors: Yorito Ohta, Hyogo; Kaoru Inoue, Shiga; Mitsuru Tanabe, Osaka, all of Japan

[73] Assignee: Matsushita Electronics Corporation, Osaka, Japan

[21] Appl. No.: 670,931

[22] Filed: Jun. 26, 1996

[30] Foreign Application Priority Data

Jul. 31, 1995 [JP] Japan ................. 7-194828

[51] Int. Cl.⁶ ............... H01L 31/0328; H01L 31/0336; H01L 31/072; H01L 31/109
[52] U.S. Cl. .................. 257/194; 257/192; 257/180
[58] Field of Search ................. 257/194, 192, 257/180, 184

[56] References Cited

U.S. PATENT DOCUMENTS 5,508,530  4/1996  Nakajima ................. 257/194
5,521,403  5/1996  Usui et al. ................. 257/194

FOREIGN PATENT DOCUMENTS 7-066391  3/1995  Japan.
7-086309  3/1995  Japan.

*Primary Examiner*—Stephen Meier
*Attorney, Agent, or Firm*—McDermott, Will & Emery

[57] ABSTRACT

A channel layer of n-type GaAs doped with Si as an impurity is formed on a GaAs semiinsulating substrate. A gate electrode of, for example, aluminum is formed on the channel layer. The gate electrode is in Schottky-contact with channel layer. Formed on opposite sides of the gate electrode on the channel layer are drain- and source side electric field relaxation layers of n-type $In_xG_{1-x}As$ doped with impurities. Each electric field relaxation layer substantially produces a potential difference at its lateral edge portion by an electric current flowing across the lateral edge portion. A WSi drain electrode is formed on the drain-side electric field relaxation layer. A WSi source electrode is formed on the source-side electric field relaxation layer.

6 Claims, 6 Drawing Sheets

(a)

(b)

FIELD-EFFECT TRANSISTOR AND FABRICATION METHOD

BACKGROUND OF THE INVENTION

This invention generally relates to field-effect transistors. The present invention pertains in particular to a field-effect transistor where high drain breakdown voltage is required and to its fabrication method.

Of various field-effect transistors, GaAs MESFET, because of its excellent performance, has recently been in great demand as progress is made in communication equipment such as portable telephones. For example, a power FET finds applications in amplifiers for transmission by making use of characteristics of GaAs MESFET such as low-voltage operation and low power consumption characteristics. Additionally, as the communication means changes from analog to digital system, a low-distortion power FET is required for use in the transmission amplifier.

Both GaAs MESFET with an epitaxial growth film and MISFET (Metal Insulator Semiconductor FET) with an undoped layer (i.e., a layer that is not implanted with impurities) formed directly underneath the gate electrode are power FETs suitable for the transmission amplifier. There have been demands for high-performance GaAs MESFET and MISFET. HFET (Heterojunction FET) with a two-dimensional electron gas region in the channel layer has been put to various high-frequency practical applications.

High-performance devices are accomplished by miniaturization. However, miniaturization presents the problem that it becomes difficult to maintain a drain breakdown voltage that is practically easy to handle.

The problems of gate-drain breakdown voltage are discussed. The aforesaid FETs have the same basic operation principle and these FETs are generically called FET in the following description.

Gate-drain breakdown voltage of a FET is determined by the impurity concentration directly underneath the gate electrode and by the distance between the gate electrode and the drain electrode. As can be seen in the foregoing MISFET, as the impurity concentration becomes lower, the drain breakdown voltage is improved. As the distance between the gate electrode and the drain electrode becomes greater, the drain breakdown voltage is improved.

FIG. 8 is a cross-sectional view of a conventional MESFET having an epitaxial growth film. 1 is a semiinsulating substrate of GaAs. 2 is a channel layer of n-type GaAs doped with silicon as an impurity. 3A is a drain-side contact layer formed of n$^+$-type GaAs or n$^+$-type InGaAs heavily doped with silicon as an impurity. 4A is a source-side contact layer formed of n$^+$-type GaAs heavily doped with silicon as an impurity. The channel layer 2, the drain-side contact layer 3A and the source-side contact layer 4A are generally formed by means of crystal growth. 5 is a gate electrode formed of, for example, aluminum. The gate electrode 5 is in Schottky-contact with the channel layer 2. 6 is a drain electrode formed of, for example, AuGe. The drain electrode 6 is in ohmic contact with the drain-side contact layer 3A. 7 is a source electrode formed of, for example, AuGe. The source electrode 7 is in ohmic contact with the source-side contact layer 4A.

FIG. 8 illustrates a structure where both the drain-side contact layer 3A and the source-side contact layer 4A are formed by so-called single recess etching. The drain-side contact layer 3A and the source-side contact layer 4A are formed as follows. A contact layer is formed on the channel layer 2. Regions of the contact layer near the gate electrode 5 are wet-etched using a resist pattern for gate electrode formation, to form the drain- and source-side contact layers 3A and 4A. The gap between the gate electrode 5 and the drain-side contact layer 3A (the source-side contact layer 4A) narrows. This produces the problem that the drain breakdown voltage becomes insufficient, as shown in Japanese Patent Application Pub. No. 7-66391. This is explained as follows. The resistivity of the drain- and source-side contact layers 3A and 4A is from 1/10 to 1/100 of the resistivity of the channel layer 2. Therefore, the internal electric potential of the drain-side contact layer 3A becomes approximately equal to that of the drain electrode 6. As a result, the difference in potential between the gate electrode 6 and the drain electrode 7 is substantially produced only between a drain-side edge portion of the gate electrode 6 and a gate-side edge portion of the drain-side contact layer 3A.

FIG. 9 illustrates a structure for improving the above-described problem. For example, Japanese Patent Application Pub. No. 7-86309 shows a structure in which a drain-side contact layer 3B and source-side contact layer 4A are formed by so-called double recess etching. The source-side contact layer 4A of FIG. 9 is identical in structure with the source-side contact layer 4A of FIG. 8. However, the drain-side contact layer 3B of FIG. 9 is different from the drain-side contact layer 3A of FIG. 8 about the distance to the gate electrode 5, in other words the gap between the drain-side contact layer 3B and the gate electrode 5 is wider than the gap between the drain-side contact layer 3A and the gate electrode 5. The term of "double recess etching" means a technique in which, after the gate electrode 5 is recess-etched using a resist pattern for gate electrode formation, the drain- and source-side contact layers 3B and 4A are formed using a resist pattern for contact layer formation.

In the FIG. 9 structure, the drain-side contact layer 3B is located at a distance from the gate electrode 5 in order to obtain a high drain breakdown voltage. This arrangement, however, increases the drain resistance, resulting in degradation of the other characteristics of FET. Additionally, such double recess etching makes the fabrication process complicated. Another disadvantage of the double recess etching is that the threshold of FET greatly varies and the yield decreases.

SUMMARY OF THE INVENTION

Bearing in mind the above-described problems with the prior art techniques, the present invention was made. Accordingly it is an object of this invention to manufacture, at an adequate yield rate, field-effect transistors with a high gate-drain breakdown voltage and low drain resistance.

In order to achieve the aforesaid object, a conventional contact layer is replaced with an electric field relaxation layer formed in accordance with the present invention. The electric field relaxation layer of the present invention substantially produces a potential difference between opposite sides of a gate-electrode-side lateral edge portion thereof by an electric current flowing across the lateral edge portion.

The present invention provides a field-effect transistor. This field effect transistor comprises:

(a) a semiinsulating substrate;

(b) a channel layer which is formed on the semiinsulating substrate;

(c) a gate electrode which is formed on the channel layer;

(d) electric field relaxation layers which are formed on the channel layer such that the electric field relaxation layers are located on both sides of the gate electrode, each electric field relaxation layer substantially producing a potential difference between opposite sides of a gate-electrode-side lateral edge portion thereof by an electric current flowing across the lateral edge portion;

(e) a drain electrode and a source electrode which are formed on the electric field relaxation layers, respectively.

In accordance with the field-effect transistor of the present invention, potential difference is substantially produced between the opposite sides of the lateral edge portion by a flow of electric current across the lateral edge portion, whereupon the difference in potential between a drain-electrode-side edge portion of the channel layer and a region under the gate electrode is relaxed. Because of this, the gate-drain breakdown voltage can be improved with no increase in drain resistance.

It is preferred that in the foregoing field-effect transistor the potential difference, produced by the electric field relaxation layer between the opposite sides of the gate-electrode-side lateral edge portion, is 1/10 or more of the potential difference between the drain electrode and the gate electrode. As a result of such arrangement, the potential difference between the drain-electrode-side edge portion of the channel layer and the region under the gate electrode is 9/10 or less of the potential difference between the drain electrode and the gate electrode. This ensures that the gate-drain breakdown voltage is improved.

It is preferred that in the foregoing field-effect transistor the sheet resistance of the electric field relaxation layer is in the range of from 1/1 to 1/5 of the sheet resistance of the channel layer. Accordingly, the potential difference between the drain-electrode-side edge portion of the channel layer and the region under the gate electrode is greatly reduced when compared to the potential difference between the drain electrode and the gate electrode thereby ensuring that the gate-drain breakdown voltage is further improved.

It is preferred that in the foregoing field-effect transistor the electric field relaxation layer is formed of n-type $In_xGa_{1-x}Ga_{1-x}As$ and the semiinsulating-substrate-side value of "x" of the $In_xGa_{1-x}As$ in the electric field relaxation layer is 0 while the drain-electrode-side value of "x" in the electric field relaxation layer is 0.5 or more. Since the value of "x" of the $In_xGa_{1-x}As$ is 0 on the semiinsulating substrate side of the electric field relaxation layer, this reduces the band gap between the electric field relaxation layer and the channel layer, resulting in reduction of the contact resistance between the electric field relaxation layer and the channel layer. Additionally, since the value of "x" of the $In_xGa_{1-x}As$ is 0.5 or more on the drain electrode side of the electric field relaxation layer, this reduces the band gap between the drain electrode and the electric field relaxation layer. This brings the electric field relaxation layer in ohmic contact with the drain electrode at low contact resistance, regardless of the n-type impurity concentration and without having to subject the drain electrode to alloying. Accordingly, both the contact resistance between the electric field relaxation layer and the channel layer and the contact resistance between the drain electrode and the electric field relaxation layer are reduced, whereupon electric current can effectively be directed from the drain electrode to the channel layer via the lateral edge portion of the electric field relaxation layer. Further relaxation of the electric field can be achieved.

In such a case, it is preferred that the drain and source electrodes are formed of a high melting-point metal. This arrangement allows both the drain electrode and the source electrode to be in ohmic contact with the n-type $In_xGa_{1-x}As$ with good physical adhesion.

It is preferred that in the foregoing field-effect transistor a composition of the channel layer side of the electric field relaxation layer is identical with a composition of the electric field relaxation side of the channel layer. As a result of such arrangement, the energy band becomes continuous at the interface between the electric field relaxation layer and the channel layer, whereupon the contact resistance between the electric field relaxation layer and the channel layer decreases.

It is preferred that in the foregoing field-effect transistor the distance between the drain electrode and the gate electrode is greater than the distance between the source electrode and the gate electrode. Such arrangement provides the advantage that, because of the synergistic effect of electric field relaxation by the electric field relaxation layer and arrangement of forming the drain electrode at a distance from the gate electrode, the gate-drain breakdown voltage is further improved.

The present invention provides a method of fabricating a field-effect transistor. This method comprises the steps of:

(a) a first step of forming a channel layer on a semiinsulating substrate;

(b) a second step of forming on the channel layer an electric field relaxation layer which substantially produces a potential difference between an upper edge portion and a lower edge portion thereof by an electric current flowing between the upper edge portion and the lower edge portion;

(c) a third step of:
forming on the electric field relaxation layer a resist pattern with an opening at a gate electrode formation region in the electric field relaxation layer;
thereafter etching the electric field relaxation layer by using the resist pattern as a mask to remove the gate electrode formation region;

(d) a fourth step of:
depositing a metallic film all over the semiinsulating substrate;
removing the resist pattern to form a gate electrode composed of the metallic film on the channel layer; and (f) a fifth step of forming a drain electrode and a source electrode on the area of the both sides of the gate electrode on remaining portions of the electric field relaxation layer.

In accordance with the field-effect transistor formation method of the present invention, the resist pattern for removing the gate electrode formation region of the electric field relaxation layer is used to form the gate electrode. As a result, the gate electrode can be formed by single recess etching. Additionally, the electric field relaxation layer, produces a potential difference by electric current flowing between an upper edge portion and lower edge portion of the electric field relaxation layer, as a result of which potential difference is substantially produced between the opposite sides of the gate-electrode-side lateral edge portion of the electric field relaxation layer by a flow of electric current across the lateral edge portion.

Accordingly, it becomes possible to make a field-effect transistor of the present invention at an adequate yield rate by single recess etching. Further, it is possible to arrange the drain and source electrodes at desirable locations of the electric field relaxation layer, whereupon both gate-drain breakdown voltage and gate-source breakdown voltage can be designed with great latitude. Additionally, since the value of the aforesaid breakdown voltages can be changed by changing the sheet resistance of the electric field relaxation layer or by changing the carrier concentration and thickness of the electric field relaxation layer, this eliminates the need of carrying out a design change of a mask for device preparation according to the type of application.

It is preferred that in the foregoing field-effect transistor formation method the second step includes the step of forming the electric field relaxation layer by crystal growth so that the electric field relaxation layer has a sheet resistance of from $\frac{1}{1}$ to $\frac{1}{5}$ of the sheet resistance of the channel layer.

It is preferred that in the foregoing field-effect transistor formation method the second step includes the step of forming the electric field relaxation layer by crystal growth so that the electric field relaxation layer has a composition of n-type $In_xGa_{1-x}As$ and the semiinsulating-substrate-side value of "x" of the $In_xGa_{1-x}As$ in the electric field relaxation layer is 0 while the drain-electrode-side value of "x" in the electric field relaxation layer is 0.5 or more. In such a case, it is preferred that the metallic film in the fourth step is composed of a high melting-point metal.

It is preferred that in the foregoing field-effect transistor formation method the second step includes the step of forming the field effect relaxation layer by crystal growth so that a composition of the channel layer side of the electric field relaxation layer is identical with a composition of the electric field relaxation side of the channel layer.

It is preferred that in the foregoing field-effect transistor formation method the fifth step includes the step of forming the drain electrode and the source electrode so that the distance between the drain electrode and the gate electrode is greater than the distance between the source electrode and the gate electrode.

DETAILED DESCRIPTION OF THE INVENTION

Preferred embodiments of the field-effect transistor according to the present invention are now described with reference to the accompanying drawing figures.

Figure 1:
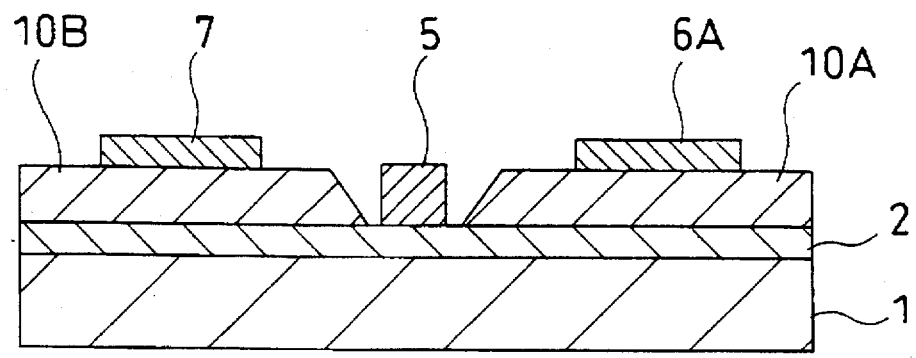
FIG. 1 is a cross-sectional view of a field-effect transistor in accordance with a first embodiment of the present invention.

FIG. 1 shows in cross section the structure of a GaAs MESFET in accordance with a first embodiment of the present invention. 1 is a semiinsulating substrate of GaAs. 2 is a channel layer doped with silicon as an impurity. 10A and 10B are drain- and source-side electric field relaxation layers formed of n-type $In_xGa_{1-x}As$ doped with an impurity. Each electric field relaxation layer 10A, 10B substantially produces a potential difference between opposite sides of a lateral edge portion by an electric current flowing across the lateral edge portion. Formed on the channel layer 2 is a gate electrode 5 formed of, for example, aluminum. The gate electrode 5 is in Schottky-contact with the channel layer 2. 6A is a WSi drain electrode formed on the channel layer 2. 7 is a WSi source electrode formed on the channel layer 2.

Figure 2:
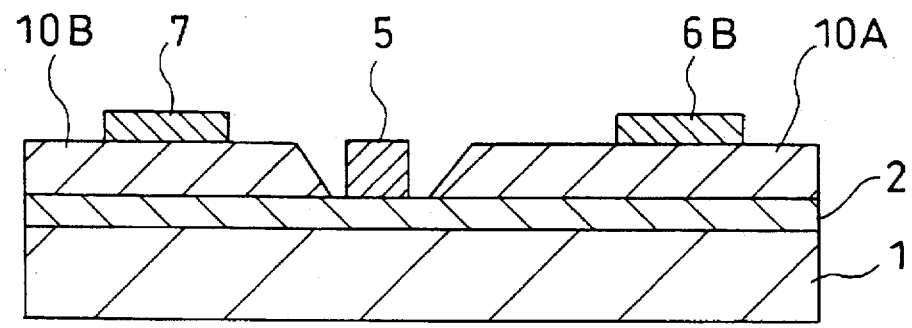
FIG. 2 is a cross-sectional view of a field-effect transistor in accordance with a second embodiment of the present invention.

FIG. 2 shows in cross section the structure of a GaAs MESFET in accordance with a second embodiment of the present invention. In FIGS. 1 and 2, like reference numerals are used for like and corresponding parts and their respective descriptions are not made here. The second embodiment is characterized in that the drain electrode 6A is formed at a distance from the gate electrode 5 for improving the breakdown voltage. In other words, the distance between the drain electrode 6A and the gate electrode 5 is greater than the distance between the source electrode 7 and the gate electrode 5.

Figure 3:
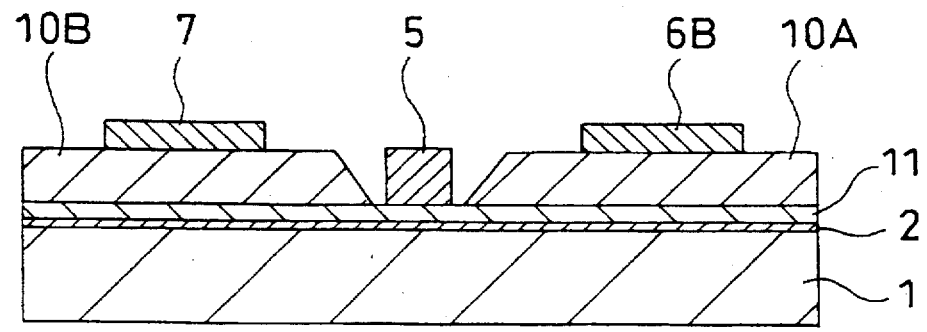
FIG. 3 is a cross-sectional view of a field-effect transistor in accordance with a third embodiment of the present invention.

FIG. 3 shows in cross section the structure of a GaAs MISFET or the structure of a HFET in accordance with a third embodiment of the present invention. In FIGS. 1 and 3, like reference numerals are used for like and corresponding parts, and their respective descriptions are not made here. The third embodiment is characterized in that an undoped layer 11 is formed on the channel layer 2 for further improving the breakdown voltage. For the case of a HFET, the channel layer 2 comprises a two-dimensional electron gas region and a two-dimensional electron gas supply region.

A method of fabricating a field-effect transistor of the present invention is now described below. The FETs of the first to third embodiments are formed by substantially the same steps except for the film growth step. Accordingly, a method of fabricating a field-effect transistor of the first embodiment, as a typical example, is explained by making reference to FIG. 4 comprised of FIGS. 4(a)–(e).

Figure 4A:
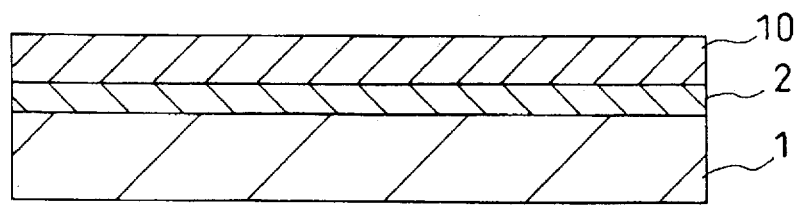
FIGS. 4(a)–(e) are cross-sectional views useful for understanding steps of the fabrication of a field-effect transistor made in accordance with the first embodiment.

Referring first to FIG. 4(a), the channel layer 2 and the electric field relaxation layer 10 are formed in that order on the semiinsulating substrate 1 by means of crystal growth.

Figure 4B:
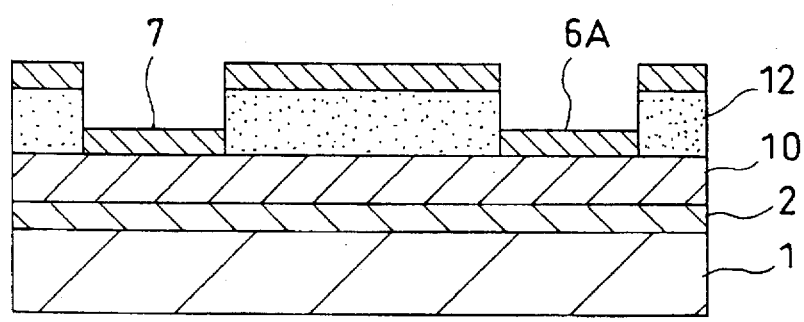

As shown in FIG. 4(b), a first resist pattern 12 is formed on the electric field relaxation layer 10. A metal, which is an electrode formation material, is deposited using the first resist pattern 12 as a mask, to form the drain electrode 6A and the source electrode 7 on the electric field relaxation layer 10. Thereafter, the metallic layer on the first resist pattern 12 is removed by lift-off. In cases where a metal with a high melting point is used as an electrode formation material, such a high-melting-point metal is first deposited on the entire surface and unnecessary portions of the metal are removed by, for example, milling.

Figure 4C:
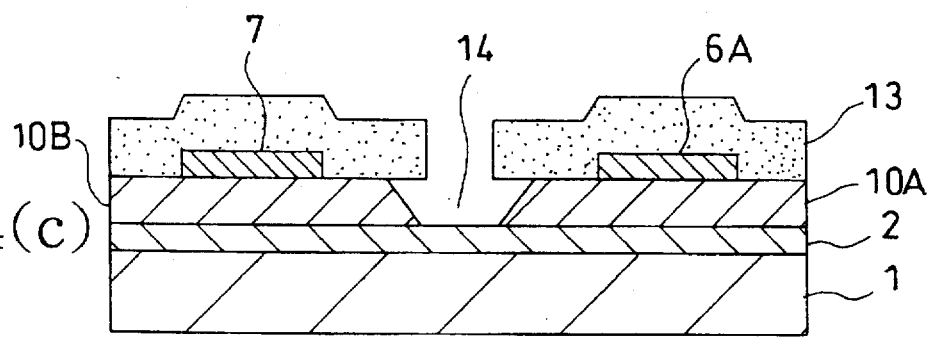

Referring now to FIG. 4(c), a second resist pattern 13 with an opening at a gate electrode formation region is formed. The electric field relaxation layer 10 is wet-etched in which the second resist pattern 13 is used as a mask, to form a recess portion 14 and to expose the channel layer 2. As a result, the drain-side electric field relaxation layer 10A and the source-side electric field relaxation layer 10B are formed.

Figure 4D:
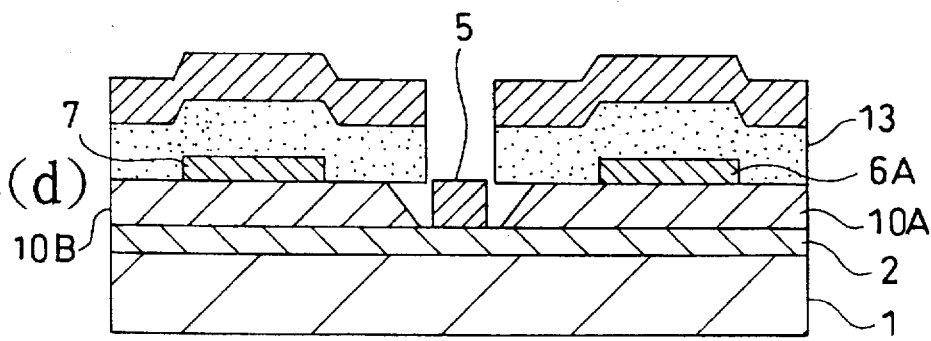
Figure 4E:
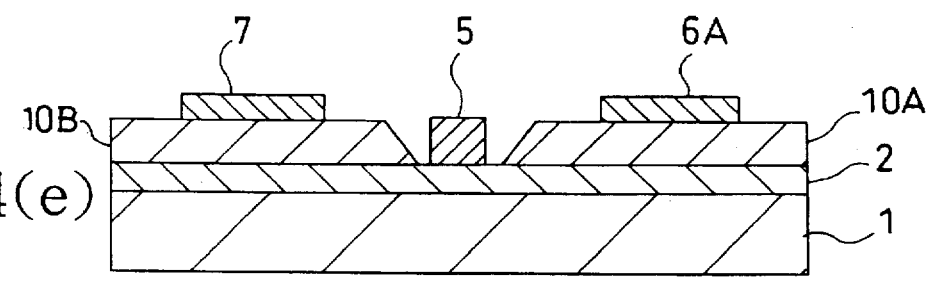

As shown in FIG. 4(d), a metal, which is a gate electrode formation material, is deposited all over the surface, to form the gate electrode 5 in the recess portion 14. Thereafter, the metallic layer deposited on the second resist pattern 13 is removed by lift-off. As a result, a field-effect transistor of the first embodiment is obtained, as shown in FIG. 4(e).

In order to clearly define the effect of the electric field relaxation layers 10A and 10B, the mechanism and test results of these relaxation layers are described with reference to FIGS. 5–7.

Figure 5:
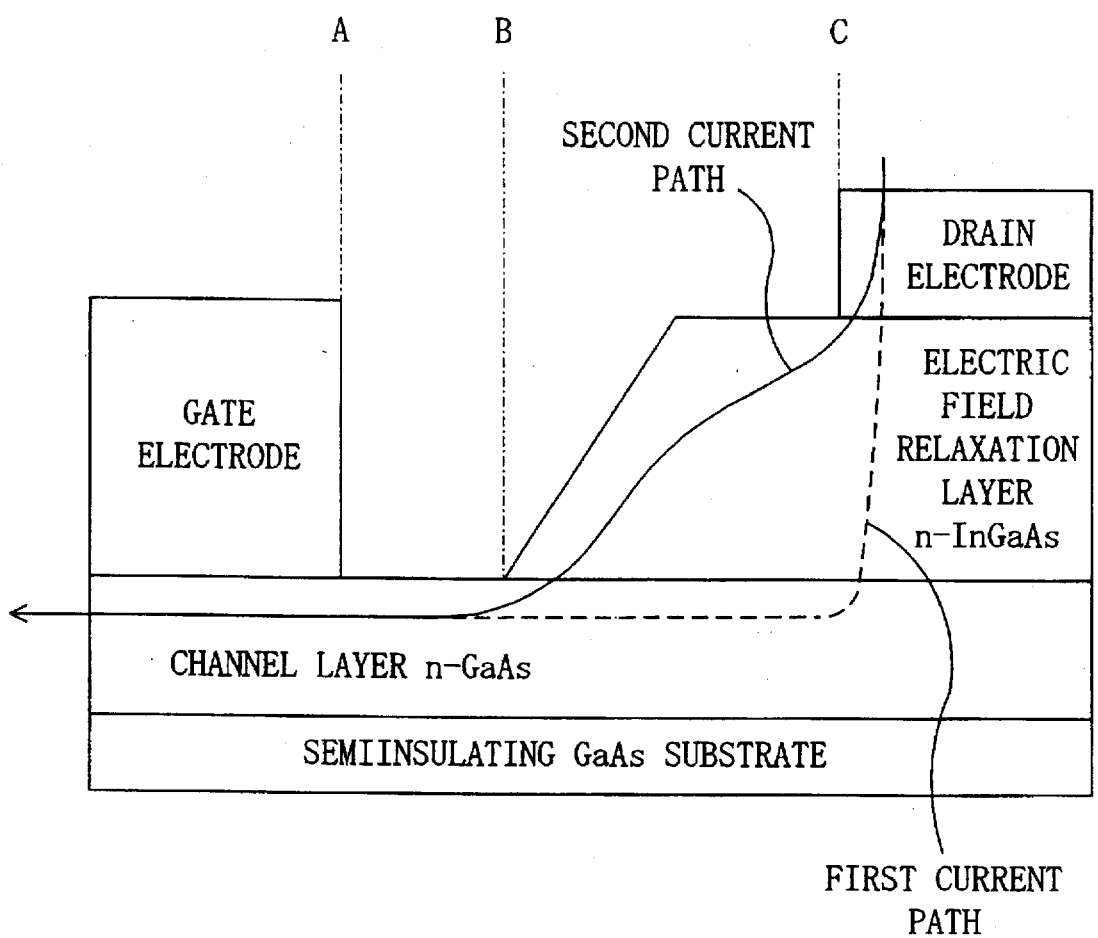
FIG. 5 is a conceptual diagram showing the flow of electric current in a field-effect transistor of the first embodiment.
Figure 6:
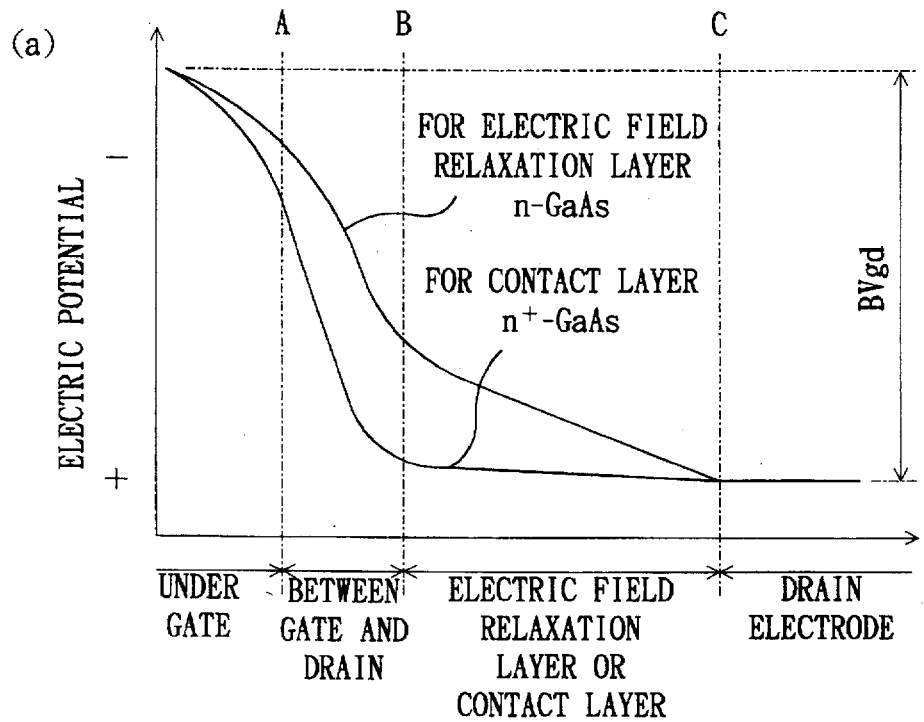
FIGS. 6(a) and (b) are conceptual diagrams showing the distribution of electric fields of a field-effect transistor of the first embodiment and a conventional field-effect transistor.
Figure 6:
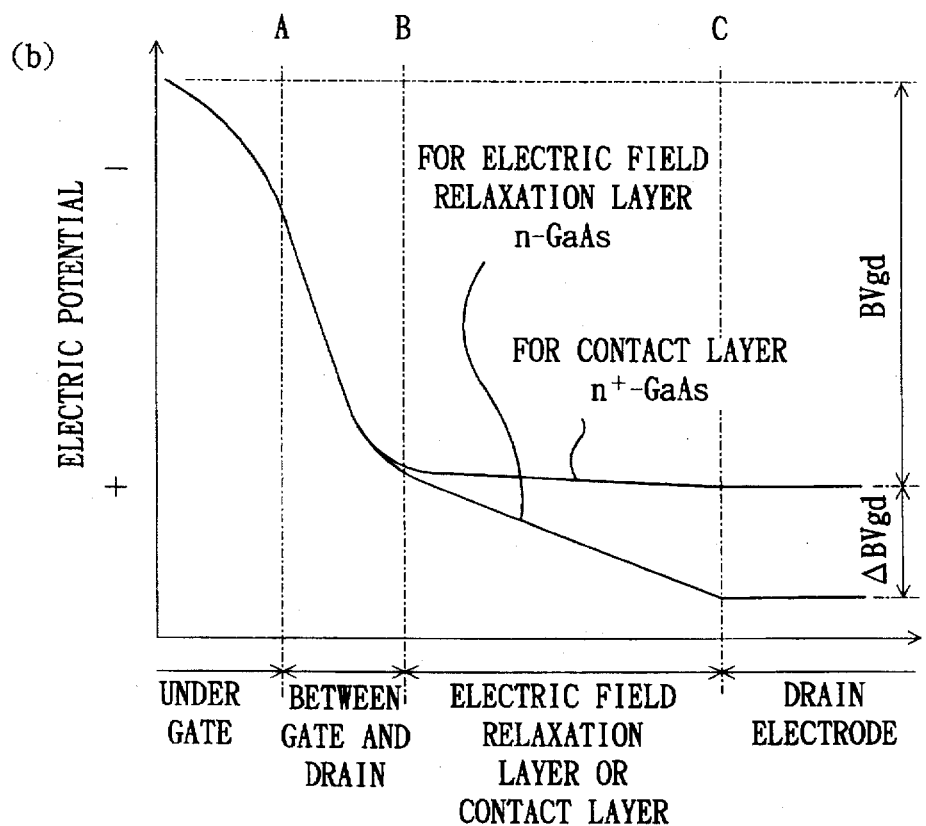

FIG. 5 shows a flow of electric current from the drain electrode to a part of the channel layer underneath the gate electrode. FIGS. 6(a)–(b) each qualitatively show the distribution of electric potential along the current flow. Suppose that the channel layer is formed having a sheet resistance of, for example, 500Ω. In this case, if the electric field relaxation layer has a sheet resistance of from 500 to 100Ω (i.e., from ⅕ to ⅕ of the sheet resistance of the channel layer), an electric current that flows along a lateral edge portion of the electric field relaxation layer is from 50% to 83% of the total electric current that flows from the drain electrode to the part of the channel layer underneath the gate electrode. In other words, the electric current that flows from the drain electrode to the under-gate part can roughly be divided into two electric currents, (A) the electric current that flows vertically within the electric field relaxation layer and (B) the electric current that flows along the lateral edge portion of the electric field relaxation layer.

In a conventional structure, a contact layer is formed between the channel layer and the drain electrode. In accordance with this structure, the resistance of the contact layer is low, so that the resistance of a first electric current path, which vertically extends through the contact layer from the drain electrode and then horizontally extends in the channel layer, is very great when compared to the resistance of a second electric current path that extends along a lateral edge portion of the contact layer from the drain electrode. Therefore, most of the total electric current flowing from the drain electrode to the part of the channel layer underneath the gate electrode flows along the second electric current path.

In accordance with the present invention, an electric field relaxation layer is formed between the channel layer and the drain electrode. As a result of such arrangement, the resistance of the first electric current path that vertically extends through the electric field relaxation layer from the drain electrode and then horizontally extends in the channel layer and the resistance of the second electric current path that extends along the lateral edge portion of the electric field relaxation layer from the drain electrode become close to each other, and the total electric current flowing from the drain electrode to the part of the channel layer underneath the gate electrode is divided into two electric currents, the electric current that flows through the first electric current path and the electric current that flows through the second electric current path. If the present field-effect transistor with an electric field relaxation layer and conventional field-effect transistor with a contact layer have the same potential difference between the drain electrode and the portion of the channel layer underneath the gate electrode, electric current flowing along the second electric current path in the present field-effect transistor becomes less than electric current flowing along the second electric current path in the conventional field-effect transistor.

Accordingly, the distribution of potential along the electric current flow becomes the one as shown in FIG. 6(a). Electric field between the gate-electrode-side edge portion and drain-electrode-side edge portion in the channel layer (between A and B) in cases where the electric field relaxation layer is formed, is small as compared to electric field between the gate-electrode-side edge portion and drain-electrode-side edge portion in the channel layer (between A and B) in cases where the contact layer is formed. In other words, the provision of the electric field relaxation layer makes it possible to greatly relax the A–B electric field.

Suppose that the distance from the drain-side edge portion of the gate electrode in the channel layer to the gate-electrode-side edge portion in the electric field relaxation layer (contact layer) is equal to the distance from the gate-side edge portion of the electric field relaxation layer (contact layer) in the channel layer to the drain electrode. In conventional cases where the contact layer is formed having a sheet resistance of from ⅒ to ¹⁄₁₀₀ the sheet resistance of the channel layer, about 92% to about 99% of voltage applied between the gate electrode and the drain electrode is applied to the channel layer. In this case, the contact layer has little effect on relaxation of the gate-drain (between A and B) electric field in the channel layer. Conversely, in the present invention the electric field relaxation layer is formed having a sheet resistance of from ⅕ to ⅕ the sheet resistance of the channel layer. As a result of such arrangement, from about ⅓ to about ½ of voltage applied between the gate electrode and the drain electrode is applied to the electric field relaxation layer (between B and C), whereupon the gate-drain (A–B) electric field in the channel layer is relaxed.

The reason why the provision of the electric field relaxation layer enhances gate-drain breakdown voltage is explained by making reference to FIGS. 6(a) and (b). In FIGS. 6(b) and (b), $BV_{gd}$ is the gate-drain breakdown voltage.

As can be seen from FIG. 6(a), the gradient of gate-drain (A–B) electric field in cases where the electric field relaxation layer is formed is much gradual when compared to the gradient of gate-drain (A–B) electric field in cases where the contact layer is formed. Because of this, if it is supposed that the gate-drain electric field gradient in cases where the contact layer is formed corresponds to the electric field gradient for gate-drain breakdown voltage, the gate-drain (A–B) electric field gradient in the channel layer in cases where the electric field relaxation layer is formed, is given margins against the gate-drain breakdown voltage.

As shown in FIG. 6(b), if the gate-drain (A–B) electric field in the channel layer in cases where the electric field relaxation layer is formed is made approximately equal to the gate-drain (A–B) electric field in the channel layer in cases where the contact layer is formed, the gate-drain breakdown voltage becomes $BV_{gd}+\Delta BV_{gd}$, in other words it increases by $\Delta BV_{gd}$.

Figure 7:
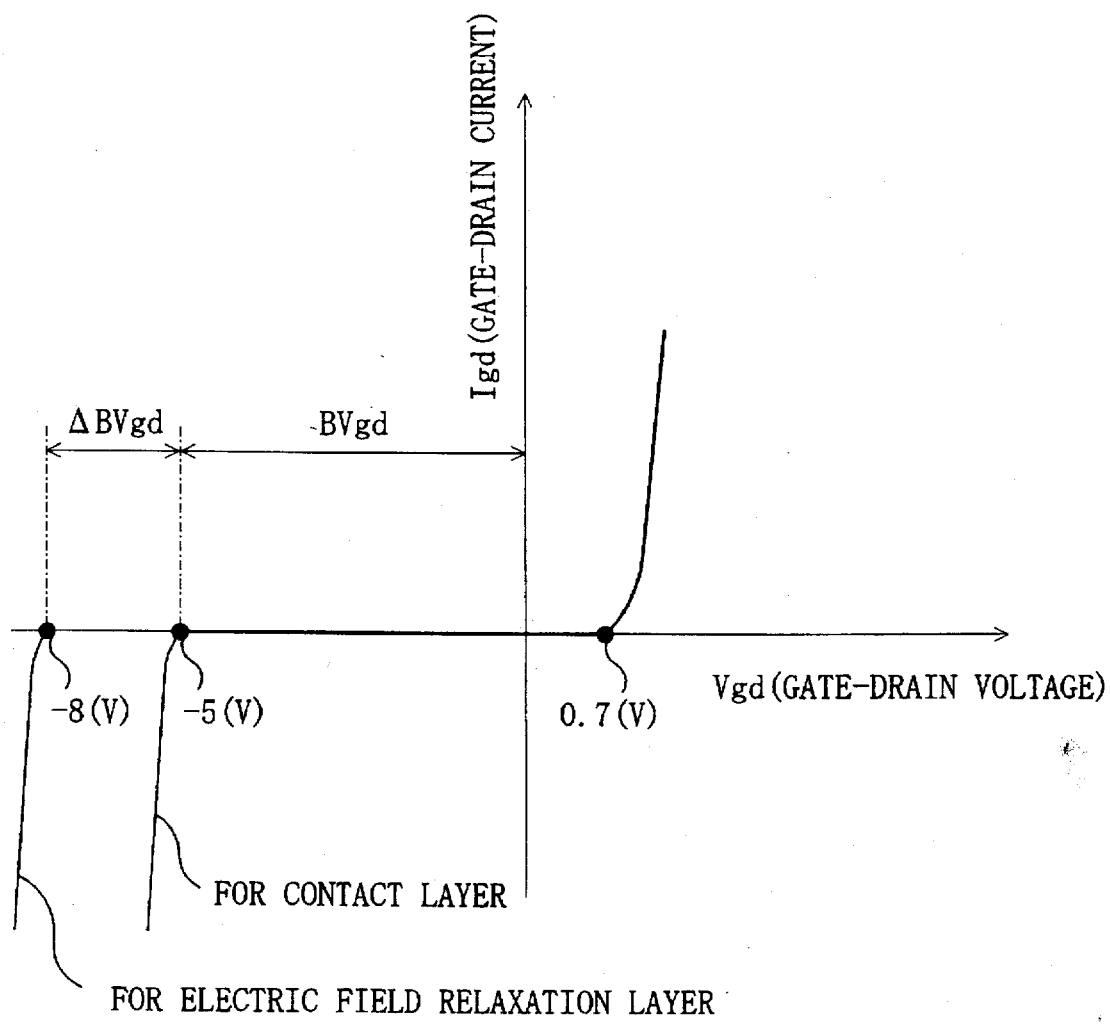
FIG. 7 shows results of the testing showing the breakdown voltages of a field-effect transistor of the first embodiment and a conventional field-effect transistor.
Figure 8:
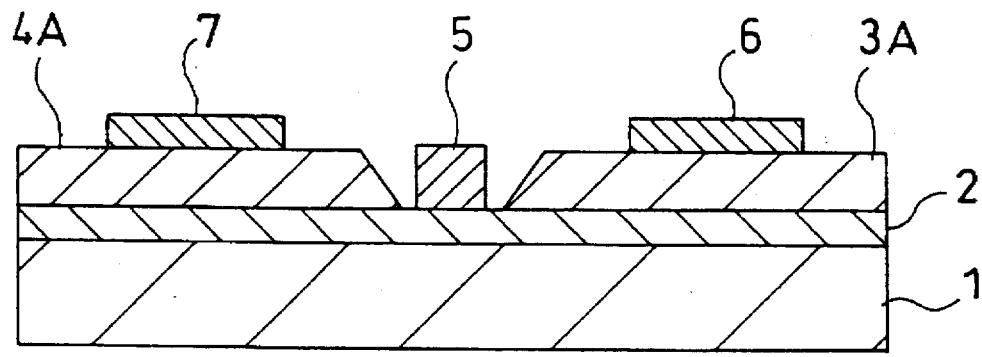
FIG. 8 is a cross-sectional view of a first field-effect transistor made in accordance with a prior art technique.
Figure 9:
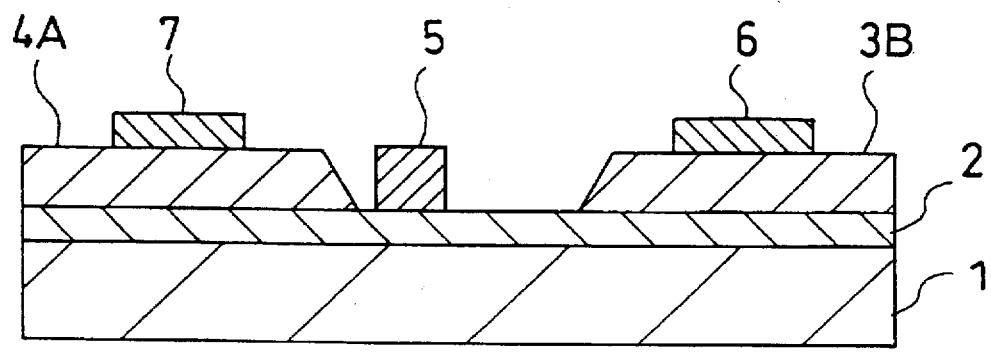
FIG. 9 is a cross-sectional view of a second field-effect transistor made in accordance with a prior art technique.

In FIG. 7, the gate-drain breakdown voltage in a GaAs MESFET of the second embodiment of this invention is compared with the gate-drain breakdown voltage in a conventional GaAs MESFET (see FIG. 8) that is made by the same number of fabrication steps as the second embodiment's GaAs MESFET.

As can clearly be seen from FIG. 7, the gate-drain breakdown voltage changes from −5 V to −8 V (an increase of −3 V) because of the synergistic effect of electric field relaxation by the electric field relaxation layer and arrangement in which the drain electrode is formed at a distance from the gate electrode. In a conventional technique, even if the drain electrode is formed at a distance from the gate electrode, gate-drain breakdown voltage is not improved very much, for the difference in potential between the gate-side edge portion of the contact layer and the drain electrode is small.

Conversely, in accordance with the present invention, the sheet resistance of the electric field relaxation layer is great, and therefore the potential difference between the gate-side edge portion of the electric field relaxation layer and the drain electrode becomes great. As a result of such arrangement, the gate-drain breakdown voltage can remarkably be improved when the drain electrode is placed at a distance from the gate electrode.

It is possible to form the electric field relaxation layer of the present invention from a usual n-type GaAs layer. In such a case, in order to bring the drain and source electrodes in ohmic contact with the n-type GaAs electric field relaxation layer, it is necessary to subject the drain and source electrodes to a thermal treatment for alloying.

As the n-type impurity concentration in the n-type GaAs layer increases, the contact resistance of the drain and source electrodes decreases. Accordingly, in the present invention, the contact resistance of the drain and source electrodes formed on the lightly-doped electric field relaxation layer is not reduced sufficiently.

Accordingly, in a structure of the first or second embodiment, when a channel layer is formed of GaAs and an electric field relaxation layer is formed of n-type $In_xGa_{1-x}As$, it is preferred that the electric field relaxation layer is crystal-grown by inclining the composition thereof such that the substrate-side value of "x" is 0 while the electrode-side value of "x" is 0.5 or more. If, in n-type $In_xGa_{1-x}As$ forming the electric field relaxation layer, the electrode-side value of "x" is above 0.5, this establishes ohmic contact between the electric field relaxation layer and the drain electrode at low contact resistance without having to perform an alloying process by thermal treatment, regardless of the n-type impurity concentration. Metal with a high melting point including Ti, Mo and W may be used to form the drain electrode, which produces the advantage that good physical adhesion to the electric field relaxation layer is achieved without having to perform thermal processing. Additionally, when the substrate-side value of "x" in the n-type $In_xGa_{1-x}As$ is 0, the substrate-side band gap in the electric field relaxation layer is continuously linked to the channel layer. This ensures that electric current is lead to a lateral edge portion of the electric field relaxation layer as shown in FIG. 5. The electric field relaxation effect is further enhanced.

In cases where the channel layer is formed of n-type GaAs, the undoped layer is formed of $Al_{0.3}Ga_{0.7}As$, and the electric field relaxation layer is formed of n-type InAlGaAs in a structure of the third embodiment, it is preferred that the following composition is employed. The upper, intermediate, and lower parts of the electric field relaxation layer are formed of n-type $In_xGa_{1-x}As$, n-type GaAs, and n-type $Al_yGa_{1-y}As$, respectively. In the upper part, the composition is inclined such that the substrate-side value of "x" is 0 while the electrode-side value of "x" is 0.5 or more, as in the first embodiment. Additionally, in the lower part, the composition is inclined such that the substrate-side value of "y" is 0.3 while the electrode-side value of "y" is 0. As a result of such arrangement, the composition of In and the composition of Al change gradually in the electric field relaxation layer and the substrate-side energy band in the electric field relaxation layer is continuously linked to the undoped layer.

The general composition of the electric field relaxation layer may be expressed by InGaAlAs.

With regard to the composition of In, it is preferred that the electrode-side composition is great while the substrate-side composition is 0, the reason for which is as follows. If the In composition ratio becomes great (for example, above 0.5), this reduces the band gap between the electric field relaxation layer and the drain electrode. As a result, the contact resistance between the electric field relaxation layer and the drain electrode is reduced, thereby establishing ohmic contact between the electric field relaxation layer and the drain electrode at low contact resistance. It is generally preferred that no In is contained in the channel layer and that the substrate-side composition of the electric field relaxation layer is identical with that of the channel layer or the undoped layer. Accordingly, it is preferred that the substrate-side composition ratio of In is 0. As a result of such arrangement, the substrate-side energy band in the electric field relaxation layer is continuously linked to the channel layer or to the undoped layer. In other words, there exists no discontinuity of the energy band between the electric field relaxation layer and the channel layer (or the undoped layer), as a result of which the contact resistance at the interface between the electric field relaxation layer and the channel layer (or the undoped layer) is reduced.

As described above, when the composition of the channel layer is GaAs, it is preferable to employ as a composition for the electric field relaxation layer a grating layer in which the electrode-side composition of In is about 50% and the In composition gradually decreases from the electrode side towards the substrate side.

Additionally, when a layer that is brought in contact with the electric field relaxation layer, e.g., an undoped layer, is formed of AlGaAs, it is preferred that the electric field relaxation layer has the following composition. The electrode-side composition of In is made great and the electrode-side composition of Al is made to be zero while the substrate-side composition of In is made to be zero and the substrate-side composition of Al is made equal to that of the substrate layer. Further, the In composition is reduced from the electrode side towards the substrate side and is made to be zero on the way to the substrate. Furthermore, the composition of Al is made to gradually increase from between the electrode side and the substrate side towards the substrate so that the substrate-side Al composition agrees with that of the substrate layer.

As described above, as the In composition is increased on the electrode side of the electric field relaxation layer, the band gap between the electrode and InGaAs forming the electric field relaxation layer decreases. As a result, the contact resistance at the interface between the electrode and the electric field relaxation layer is reduced.

As the In composition in the electric field relaxation layer is increased, the lattice constant deviates from the substrate layer, and as the deviation of the lattice constant is increased, distortion occurs in crystals forming the electric field relaxation layer. Poor crystallinity results and the characteristics of the transistor are seriously affected.

However, if the electrode-side composition of In of the electric field relaxation layer is made to be zero, the substrate-side lattice constant of the electric field relaxation layer and the lattice constant of the substrate layer agree. This improves the crystallinity of the electric field relaxation layer and good transistor characteristics are obtained.

As described above, if the In composition in the electric field relaxation layer is made to change continuously, there is no discontinuity in energy band within the electric field relaxation layer. This permits carriers (electrons) to move freely, thereby preventing the resistance in the electric field relaxation layer from becoming too great.

The structures and methods shown as an embodiment of the present invention may be applied to materials other than GaAs, regardless of the presence or absence of an undoped layer and the type of channel layer.

The invention claimed is:

1. A field-effect transistor comprising:

(a) a semi-insulating substrate;

(b) a channel layer which is formed on said semi-insulating substrate;

(c) a gate electrode which is formed on said channel layer;

(d) electric field relaxation layers which are formed on said channel layer such that said electric filed relaxation layers are located on both sides of said gate electrode, each of said electric field relaxation layers substantially producing a potential difference between opposite sides of a gate-electrode-side lateral edge portion thereof by an electric current flowing across said lateral edge portion;

(e) a drain electrode and a source electrode which are formed on said electric field relaxation layers, respectively, wherein each of said electric field relaxation layers is formed of n-type $In_xGA_{1-x}As$, and wherein the value of "x" of said n-type $In_xGa_{1-x}As$ in a side adjacent to the channel layer of the electric field relaxation layer is O, while the value of "x" in a side adjacent to the drain electrode of the electric field relaxation layer is 0.5 or more.

2. A field-effect transistor according to claim 1 wherein said potential difference, produced by said electric field relaxation layer between said opposite sides of said gate-electrode-side lateral edge portion, is $1/10$ or more of the potential difference between said drain electrode and said gate electrode.

3. A field-effect transistor according to claim 1 wherein the sheet resistance of said electric field relaxation layer is in the range of from $1/1$ to $1/5$ of the sheet resistance of said channel layer.

4. A field-effect transistor according to claim 1 wherein the distance between said drain electrode and said gate electrode is greater than the distance between said source electrode and said gate electrode.

5. A field-effect transistor according to claim 1 wherein said drain electrode and said source electrode are composed of a high melting-point metal.

6. A field-effect transistor according to claim 1 wherein a composition of the channel layer side of said electric field relaxation layer is identical with a composition of the electric field relaxation layer side of said channel layer.

* * * * *